United States Patent [19]
Dawson

[11] Patent Number: 5,519,334
[45] Date of Patent: May 21, 1996

[54] SYSTEM AND METHOD FOR MEASURING CHARGE TRAPS WITHIN A DIELECTRIC LAYER FORMED ON A SEMICONDUCTOR WAFER

[75] Inventor: Robert Dawson, Austin, Tex.

[73] Assignee: Advanced Micro Devices, Inc., Sunnyvale, Calif.

[21] Appl. No.: 314,816

[22] Filed: Sep. 29, 1994

[51] Int. Cl.$^6$ ................................................. G01R 31/02
[52] U.S. Cl. ........................................... 324/765; 324/752
[58] Field of Search ................................. 324/765, 753, 324/751, 750, 767, 158.1, 73.1, 71.3; 250/352, 310, 311; 437/8; 257/48

[56] References Cited

U.S. PATENT DOCUMENTS

| | | | |
|---|---|---|---|
| 4,301,362 | 11/1981 | Mourou | 250/211 J |
| 4,425,544 | 1/1984 | Barth | 324/767 |
| 4,456,879 | 6/1984 | Kleinknecht | 324/71.5 |
| 4,609,867 | 9/1986 | Schink | 250/310 |
| 4,968,932 | 11/1990 | Baba et al. | 324/767 |
| 5,138,256 | 8/1992 | Murphy et al. | 324/71.3 |

OTHER PUBLICATIONS

E. H. Nicollian and J. R. Brews, *MOS Physics and Technology*, (1982) pp. 424–443.
E. H. Nicollian and J. R. Brews, *MOS Physics and Technology*, (1982) pp. 531–553.

*Primary Examiner*—Vinh P. Nguyen
*Attorney, Agent, or Firm*—Kevin L. Daffer

[57] ABSTRACT

A method and device are provided for characterizing dielectrics formed upon and within an integrated circuit. The methodology includes exciting charge carriers trapped at dielectric charge traps with increasing discrete levels of energy. The energy is provided as discrete levels of photon energy. For the photons to penetrate the dielectric, a transparent conductive material is used instead of a typical gate metal. When the charge carriers are excited out of trap, an applied bias moves the carriers as current through the dielectric. From the amount of current at each discrete energy level, the type and quantity of charge carriers can be determined with rapidity and precision.

30 Claims, 3 Drawing Sheets

SYSTEM AND METHOD FOR MEASURING CHARGE TRAPS WITHIN A DIELECTRIC LAYER FORMED ON A SEMICONDUCTOR WAFER

BACKGROUND OF THE INVENTION

1. Field of the Invention

This invention relates to the testing of a semiconductor dielectric and more particularly to precision quantification of charge carrier traps within the dielectric.

2. Description of the Relevant Art

Dielectric charge traps present several problems in the semiconductor industry. A detailed description of dielectric charge traps and much of the related prior art can be found in *MOS Physics and Technology*, E. H. Nicollian and J. R. Brews (1982) pp. 424–443 (herein incorporated by reference). Charge traps are located at the interface between the dielectric and adjacent conductors as well as within the dielectric bulk. Charge traps are generally caused by defects in the dielectric. The most common defects result from impurities or irregular bonds formed in the bulk or interface region. A large quantity of irregular bonds exist as "broken bonds" at the dielectric interface region. The defects provide locations for charges to exist and migrate to. Thus, defects produce traps, wherein traps are usually uncharged but become charged when free electrons and free holes are introduced into the dielectric.

Oxide, e.g., $SiO_x$ ($1.0<x<2.0$), is a common example of the most commonly used dielectric in the semiconductor industry. If one of the oxygen atoms is missing from the oxide structure thereby producing a broken bond, a silicon atom will be left with what is commonly referred to as a "dangling bond". A dangling bond resulting therefrom will produce a corresponding hole which attracts and traps charge carriers that invade the oxide during manufacture (i.e., diffusion, implantation, etc.) and operation (electrical activation) of the semiconductor device.

Presence of a large number of charge traps in a dielectric may cause retainage problems in a device embodying memory. Charge carriers generated during device operation enter and become trapped in the oxide between the memory conductive plates. In such instances, memory characteristics are altered—either read or write capability of the corresponding memory cell. Additionally, during device fabrication, electron-hole pairs can be created predominantly during the ion implant stage. The electron-hole pairs create more trap cites and allow for further deterioration of device operability.

Other examples of devices that are prone to the problems arising from dielectric charge traps include n-channel MOSFETS, multilayer gate memory, and high voltage diodes. In n-channel MOSFETS, hot electrons originating from the surface channel or silicon substrate migrate to and affix in the gate oxide (i.e., dielectric) charge traps. The trapped charges cause transconductance degradation and threshold voltage drift with time. In multilayer gate memory applications, information is generally written and erased by electron transport between the substrate silicon and charge storage sites through the tunnel area of the gate oxide. As these electrons become trapped and accumulate as oxide charge, the current across the oxide decreases to a point during which memory function ceases. In high voltage diode applications, the diodes are frequently operated in the voltage range necessary to cause avalanche breakdown. Traps in the oxide cause the avalanche breakdown voltage to skew after repeated operations and over a period of time.

Since charge traps can have unwanted effects on device characteristics, the semiconducting industry has developed several tests to monitor and examine these traps. Determination of trap distribution is necessary to quantify the effects of traps on dielectric quality and, therefore, device operability. Two popular methods for finding trap distributions include etch-off method and the photo I-V method. The etch-off method profiles the trap distribution by repeatedly etching off layers of oxide and measuring the amount of traps at each level using radioactive or capacitance-voltage (C-V) techniques. The photo I-V method is nondestructive and more accurate than the etch-off method, but it has limited capabilities in measuring deep oxide traps.

Measurements of bulk oxide trap properties can also be performed by avalanche injecting electrons into the dielectric and determining the C-V curve. Avalanche injection creates a voltage shift in the C-V curve which is a measure of the negative charge density within the dielectric. The voltage shift is also known as the flatband voltage shift. The results can be interpreted according to methods described in *MOS Physics and Technology*, pp 531–553 (herein incorporated by reference).

Other measurements of dielectric charge traps depend on the activation energies of the intrinsic ion carriers located at dielectric trap sites. Ion impurities enter the dielectric during manufacture of the semiconductor device. Diffused or implanted impurities such as dopants migrate to and affix within the dielectric at the trap sites. Thus, charge carriers are said to "populate" traps. Different types of ion carriers require different levels of energy to release from traps or "depopulate." The energy required for a specific carrier to depopulate a trap is labeled as carrier activation energy, or $Q_c$.

Conventional knowledge associates measurement of dielectric charge traps as a function of carrier activation energy, and carrier activation energy is a function of temperature. A bias can be applied across a semiconductor dielectric. The dielectric is then heated to specific temperatures. At each temperature, the current flowing through the dielectric is measured. Current initiates when the temperature creates enough energy to depopulate ion carriers from the traps. The energy (E) applied to the dielectric at a specific temperature (T) is:

$$E=kT \qquad \text{Equ. (1)}$$

where k is Boltzmann's constant. When the energy reaches the carrier activation energy of a specific class of carrier, those carriers are mobilized from the dielectric traps. The applied bias attracts the carriers in one direction and produces a current that can be measured. As the temperature is raised to different levels, different activation energies are reached and different types of ion carriers are mobilized from the traps.

The aforementioned test produces data showing current versus energy as a function of temperature. The current peaks at specific temperature points. These peaks indicate the activation energies for specific types of carriers. The type of ion carriers are then identified by comparing the activation energies experimentally obtained to known tables of activation energies. The quantity of each type of carrier within the dielectric (in bulk or at the interface) is then determined by the amount of current corresponding to each carrier type.

Determining dielectric characteristics with temperature has several drawbacks.. Temperature often does not give the precision required for proper measurements. When the dielectric is heated to a specific temperature correlating to a certain carrier activation energy, not all of those carriers will mobilize from the traps. The activation of carriers from trap sites will follow a Maxwell-Boltzmann distribution. The Boltzmann relation expresses the probability of finding a carrier at an energy ΔE greater than the average energy at a particular temperature T:

$$\text{probability} \propto e^{-E/kT} \qquad \text{Equ. (2)}$$

At a specific activation energy determined by a given temperature, not all of the appropriate ion carriers will mobilize from the dielectric traps. The only way to mobilize all of the carriers related to a specific activation energy is to overshoot the temperature or extend temperature exposure over a period of time. The process of collecting current measurements at many different temperatures becomes a slow task. Therefore, a faster method for testing dielectric characteristics is needed.

Another problem with using temperature to determine dielectric characteristics is the inability to distinguish between some carriers. Some types of dielectric traps will have carrier activation energies that are close together. Between the temperature gradient in the dielectric and the effects of the Maxwell-Boltzmann energy distribution, the test cannot distinguish between the depopulation of different traps having similar carrier activation energies. It is difficult to gather a precise quantity of mobilized charge carriers depopulated with temperature. Hence, a test method with a more precise method of determining dielectric characteristics is needed.

Still another problem with using temperature to characterize dielectrics is that high temperatures can harm a semiconductor. Some dielectric traps have activation energies so high that depopulating the carriers from the traps require temperatures high enough to anneal the semiconductor and change the properties of the semiconductor elements. This creates more unpredictable devices. A better method for determining dielectric characteristics of carriers with high activation energies is needed.

SUMMARY OF THE INVENTION

The problems outlined above are in large part solved by the method and device of the present invention. That is, a method is provided for determining characteristics of a dielectric in a semiconducting device without using thermal excitation. Instead, the present invention uses photons as an excitation source. Photon energies are sourced to the dielectric at smaller increments (higher resolution of energy) than prior art thermal emission. Also photons depopulate charge carriers at discrete energy levels, not at Maxwell-Boltzmann distributions. The present invention results in a more precise characterization of the types and quantities of charge carriers excited by the photons. Also, the present invention avoids the annealing problems that high temperatures present to an integrated device.

Broadly speaking, the present invention contemplates a method for characterizing a dielectric within an integrated circuit. The method includes depopulating charge carriers from charge carrier traps within a dielectric. This is done by radiating the dielectric with photons at incrementally small changes of energy. In order for the photons to penetrate the dielectric, a transparent conductive material is placed above the dielectric. If some of the charge carriers are mobile at room temperature, the dielectric can be first cooled in order to trap the charge carriers at the dielectric charge traps. When the photons depopulate charge carriers from dielectric charge traps, an applied bias coupled to surrounding conductors (one of which is transparent) attracts the carriers in one direction. Carrier movement is measured by a current measuring device. The discrete photon energy levels and the corresponding charge carrier currents are then mapped. From the mapping, the types and quantity of charge carriers can be determined and the quality of the dielectric ascertained.

The invention further contemplates a device for characterizing dielectrics within an integrated circuit. The device requires a dielectric placed within a topography of a semiconductor substrate. Transparent conductive materials are placed above the dielectric to allow traverse of photons through the conductive material and into the dielectric. The dielectric is prepared having at least one charge trap populated with a charge carrier. A voltage source is connected to the integrated circuit containing the dielectric so that a potential bias is established across the dielectric. A current measuring device is also connected to the voltage source and integrated circuit combination so as to measure current through the dielectric. A light source that emits a plurality of photons at dissimilar wavelengths is positioned so as to radiate toward the dielectric. A data processor is also used to map the energy levels of the photons emitted and the corresponding charge carrier current within the dielectric. A cooling source may also be placed proximate to and in thermal conduction with the semiconductor substrate. A wafer handler can also be used to properly position the substrate topography for photon emission.

BRIEF DESCRIPTION OF THE DRAWINGS

In the detailed discussion of the invention, the following drawings will be discussed.

While the invention is susceptible to various modifications and alternative forms, specific embodiments thereof are shown by way of example in drawings and will herein be described in detail. It should be understood, however, that the drawings and description thereto are not intended to limit the invention to the particular forms disclosed, but on the contrary, the invention is to cover all modifications, equivalents, and alternatives falling within the spirit of the scope of the present invention as defined by the appended claims.

DETAILED DESCRIPTION OF THE INVENTION

Figure 1:
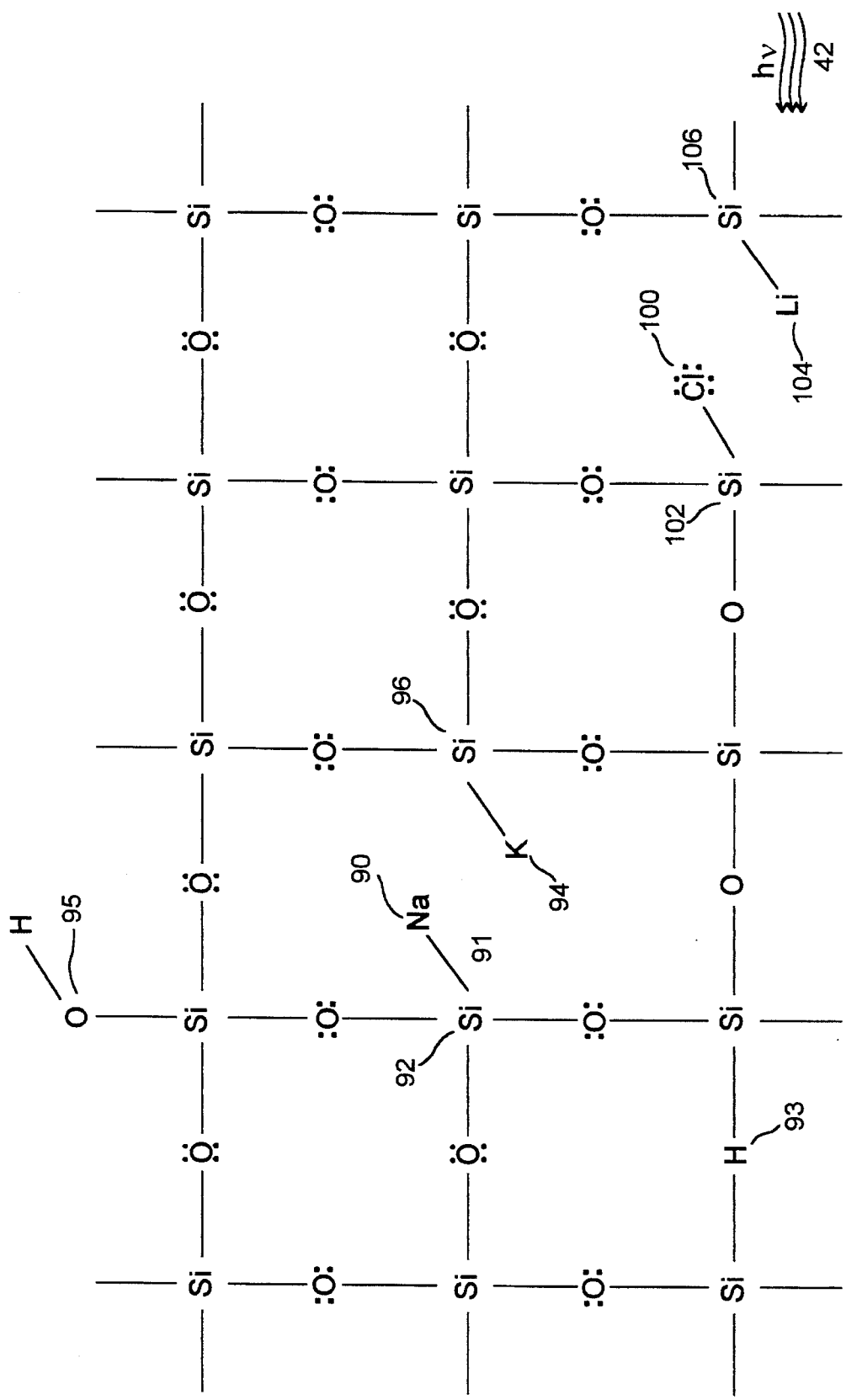
FIG. 1 is an atomic level diagram of charge carriers populating in dielectric traps.

FIG. 1 illustrates defects and results of defects upon a dielectric bond structure such as $SiO_2$. Namely, to allow charge carriers to affix thereto. The exemplary silicon and oxygen bond structure is shown in stoichiometric and nonstoichiometric proportions. FIG. 1 shows dielectric charge traps created by both dangling bonds and disruptions caused by implant of impurity ions. Dangling bonds are a result of non-stoichiometric combinations of bonded atomic structures or lack thereof. Such an occurrence is not uncommon in deposited or thermally grown oxides. FIG. 1 illustrates the effects of a missing oxygen atom resulting in two negatively charged silicon atoms 92 and 96. The charged area functions as a trap for any negatively charged impurity entering the dielectric. FIG. 1 shows a sodium ion 90 and a potassium ion 94 populating the trap sites. Also shown in FIG. 1 is a surface H and/or surface OH bonded at sites 93 and 95, respectively.

Another common charge trap results from impurities bonded to the dielectric lattice during the production of the dielectric. FIG. 1 shows a chlorine atom 100 replacing an oxygen atom in the lattice. Chlorine atom 100 contaminates the lattice during the growth process and chemically bonds to the lattice. In this case, chlorine atom 100 can only bond with one silicon atom 102. The unbonded silicon acts as a charge trap for an ion such as lithium 104.

Ion carriers depopulate trap sites when photon energies 42 are radiated on the dielectric. Each type of carrier will require a minimum level of photon energy before the carrier can break the bond with the dielectric trap. The minimum energy is defined as the carrier activation energy, or $Q_c$. Once a carrier depopulates a trap as a result of impinging photons, the carrier will drift through the lattice. The drifting carrier may populate another dielectric charge trap. The drifting carrier will depopulate the second trap if the radiating photon energies supply enough energy to overcome the second trap. In the present invention, the carriers do not simply drift in the dielectric, but are directed by an applied bias as indicated in FIG. 2.

The present invention uses the effect of light-induced photon energies rather than the prior art thermal energies on charge carriers populating dielectric traps to characterize the dielectric. The system depicted in FIG. 2 utilizes photon energies 42 to characterize a dielectric.

Figure 2:
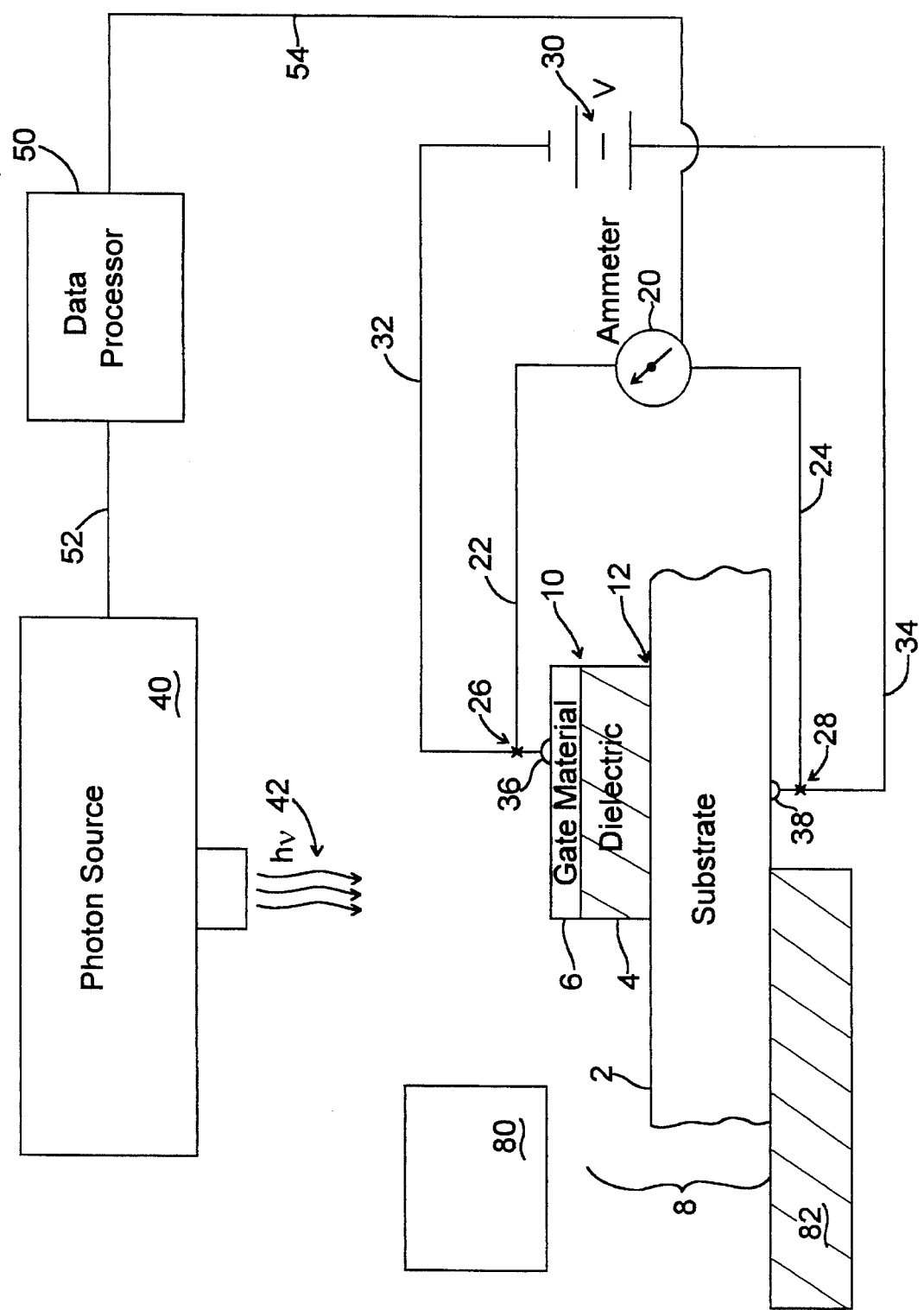
FIG. 2 is an enlarged view of a MOS capacitor utilized in a block diagram of a device or system for determining the characteristics of dielectrics according to the present invention.

The system in FIG. 2 is shown capable of characterizing any dielectric formed between two conductors, wherein the upper conductor is transparent to irradiated photons. The dielectric can be one found in a capacitive structure 8, including a gate region of metal oxide semiconductor (MOS) transistors, etc. Any semiconductor device utilizing a dielectric therefore falls within the scope and content of the present invention as one capable of characterization by photon excitation. A typical MOS capacitor consists of an underlying substrate 2, a dielectric 4, and a gate conductive material 6 on top of the dielectric 4. For the sake of simplicity, the present description will be described in terms of MOS capacitor 8.

Any type of dielectric material may be tested with this invention. Oxide is the most commonly used dielectric, but other commonly used dielectric materials including $Al_2O_3$, silicon nitride, and oxynitride composites can also be tested. The present invention thereby characterizes a dielectric produced by any method. A preferred embodiment uses thermally grown oxide such as $SiO_2$, but any method of dielectric production falls within the spirit and scope of the present invention.

The semiconductor substrate 2 in MOS capacitor 8 can be any substrate used in the industry. Silicon or gallium arsenide are the most commonly used.

The conductive material 6 on top of the dielectric 4 must be substantially transparent to photons. The transparency allows photons 42 to penetrate the gate material 6, excite, and depopulate carriers at dielectric trap sites. Typically used gate metals such as aluminum and copper compounds are opaque and do not allow photons to pass through to the dielectric.. A preferred photon translucent gate conductive material is indium tin oxide (ITO). Other transparent conductive metals or transparent conductive polymers are also acceptable. The known transparent metals, including ITO, are relatively poor conductors and decrease an integrated device's efficiency. The known transparent conductive polymers tend to create piezo stress which can result in inefficiencies and breakdowns in a device.

ITO can be deposited according to many techniques. RF diode sputtered indium tin in an oxygen and argon environment is one technique. It is understood that ITO is only one example of an optically transparent conductive material. Any thin, for example, less than approximately 1000 angstroms conductive material can be transparent in many circumstances. It is believed that polysilicon can be translucent if its thickness is sufficiently thin, usually less than 400 angstroms. Thus, ITO, or any thin conductive material, can be used interchangeably for the purposes set forth hereinbelow. Provided the chosen thickness does not "null out" transmission of the impinging photon wavelength, any thickness and any material composition which provides conductivity and transmissibility of the chosen photon wavelength falls within the spirit and scope of the present invention. The conductive material can be deposited using, for example, co-evaporation of the materials in proper proportions such that if ITO is desired, co-evaporation of indium and tin is necessary in a plasma electron beam within an oxygen ambient.

An electric potential must be applied across the dielectric of the device being characterized, MOS capacitor 8 in this case. The electric potential is established with a voltage source 30 connected by leads 32 and 34 to the substrate 2 and conductive gate material 6, respectively. The leads 32 and 34 are connected to the gate material and the substrate by spot welds or other methods at points 36 and 38. Recommended bias necessary to depopulate ion carriers to either the substrate or gate interface is 0.2 to 5.0 eV.

Current is measured by ammeter 20 or other current measuring device through leads 22 and 24. As the depopulated ion carriers in the dielectric attract toward the appropriately biased substrate or gate interface, a current is created. This creates a current that can be measured by ammeter 20.

A photon source 40 radiates the dielectric 4 with photon energies 42. Photon source 40 can be a variable monochromatic light source. A variable source may be varied to emit monochromatic light for a plurality of different wavelengths. The wavelength of the light determines the energy (E) of the photon by:

$$E = h\nu = \frac{hc}{\lambda} \qquad \text{Equ. 3}$$

where h is Planck's constant, c is the speed of light, $\nu$ is the frequency of the light, and $\lambda$ is the wavelength of the light. The preferred variable source emits a consecutive series of discrete energy levels of photons. Sweeping the device being characterized consists of emitting photons of variable energies, one discrete energy level at a time, until the entire spectrum of desired energy levels is covered. The present invention preferably comprises a sweeping of the device with photons, and that the wavelength of the light source is incrementally decreased so that the energy increases in discrete increments. A preferred embodiment of the present invention will sweep a wavelength range of 2000 nm to 193 nm at varying increments of constant energy.

The photon source 40 can either be stationary or moving with respect to the dielectric during photon radiation. The photon source 40 may move to radiate specific points of a test wafer. The movement can be accomplished in one of two ways. Photon source 40 can move over a stationary wafer 8 and radiate appropriate dielectrics, or wafer 8 can move with respect to a stationary photon source 40. Such movement can be accomplished with any acceptable wafer handling unit 82.

A data processor 50 can be used to generate useful information about the dielectric. The data processor 50 requires input information about the energy emitted by photon source 40 and the resulting charge carrier current. The data processor 50 uses the wavelength or frequency of the photons emitted by photon source 40 to determine the energy radiating on the dielectric according to Equation (3). The data processor 50 then matches the energy level to the current being measured by ammeter 20 for each discrete level of photon energy emitted. The energy level as a function of wavelength can then be plotted against the measured current to produce a graph similar to FIG. 4.

The invention cannot measure charge carriers that are depopulated before the dielectric is radiated with photon energies. Hence, the present invention preferably uses a cooling system 80 to ensure all charge carrier traps are populated with the charge carriers present in the dielectric prior to characterization. Cooling system 80 can be any type of piezoelectric or coolant circulation system often encountered in semiconductor testing and production. By lowering the temperature of the dielectric device, the charge carriers lose thermal excitation energy. Charge carriers lacking a thermal threshold energy are unable to depopulate encountered dielectric charge traps. The charge carrier activation energy needed for depopulation is quite low for some charge carriers such as $OH^-$ and $H^+$. At room temperature such charge carriers are mobile within the dielectric. Therefore, a cooling system 80 can be used to lower the charge carrier energy enough to trap these charge carriers at dielectric charge trap cites. Any temperature necessary to entrap the charge carriers targeted for test is defined as a preferred range of temperatures. Once the charge carriers populate the trap sites, then the dielectric analysis hereof depopulates the charge carriers with photon energies and the charge carrier currents can be measured and analyzed.

The present invention can be used on a test semiconductor wafer. The dielectric analysis performed on one wafer is assumed to hold similar for other wafers in the same production batch or "run". The test wafer is processed similarly to the other wafers in the run except that the test wafer has transparent conductive material 6 like ITO deposited in lieu of more typical gate metals. The dielectric 4 can be tested during production, or after the transparent conductive material is deposited, provided the voltage source 30 and current measuring device 20 are connected to dielectric device 8 and photon energies 42 penetrate the dielectric 4. The gate conductor and conductive substrate placed on opposite sides of the dielectric may be used to apply a potential field across the dielectric.

The present invention can be practiced on any specially prepared sections of a production wafer instead of on a specially prepared test wafer. In this situation, the transparent conductive material may be deposited on the entire wafer and then etched away from non-test sites. The invention is then performed on the test sites.

The present invention can also be practiced on production wafers that allow photon energies to penetrate the dielectric being characterized. This includes any wafers which use transparent conductive gate material which allows photons to reach the dielectric.

The present invention is performed by first processing a semiconductor wafer as desired except a transparent conductive material is used as the conductive gate material 6. The device containing the dielectric 8 is attached to the voltage source 30 so that an electric potential is created across the dielectric 4. The ammeter 20 is also connected in order to measure charge carrier current in the dielectric 6. The wafer is then cooled in the cooling system 80 if charge carriers with low activation energies such as $H^+$, for example, and $OH^-$ are characterized. A photon source (variable monochromatic light) 42 at a specific wavelength then radiates the dielectric 4. The wavelength is decreased at specified increments. The ammeter 20 detects current when the charge carriers depopulate. The data processor 50 stores the information, preferably in graph form as in FIG. 4. The graph reveals which carriers are present in the dielectric 4 and how many are present.

Figure 4:
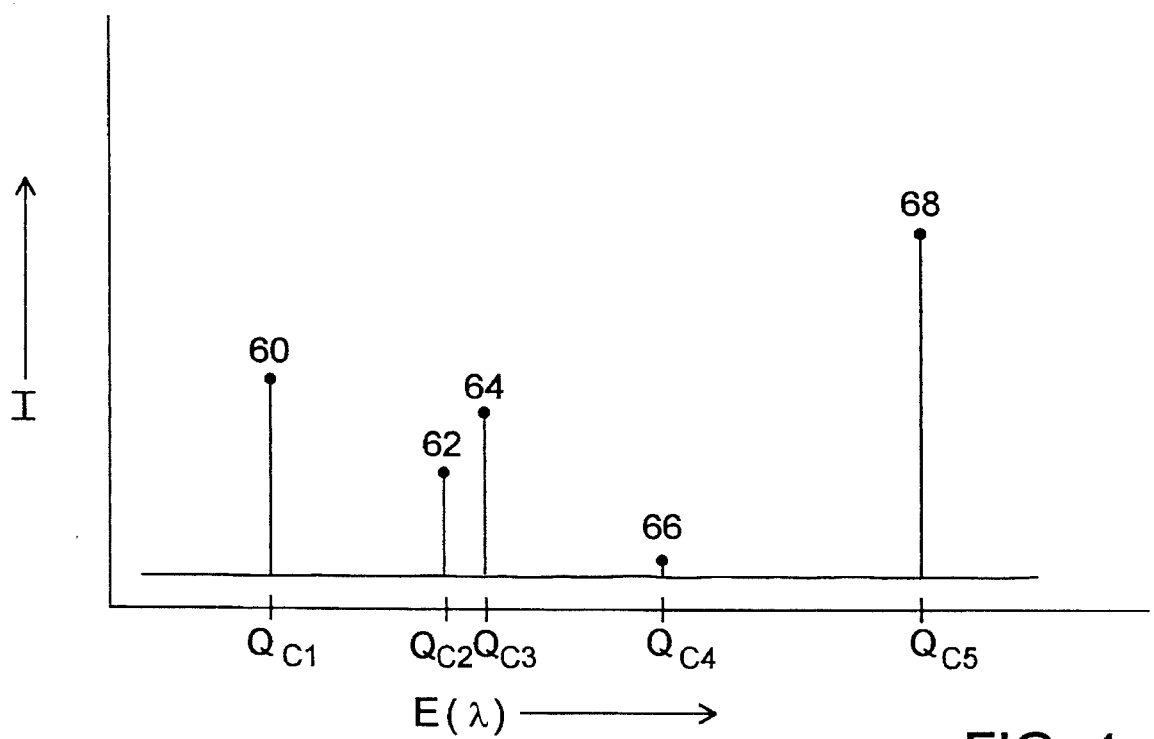
FIG. 4 is a plot of measured current versus applied energy as a function of wavelength according to the present invention.
Figure 3:
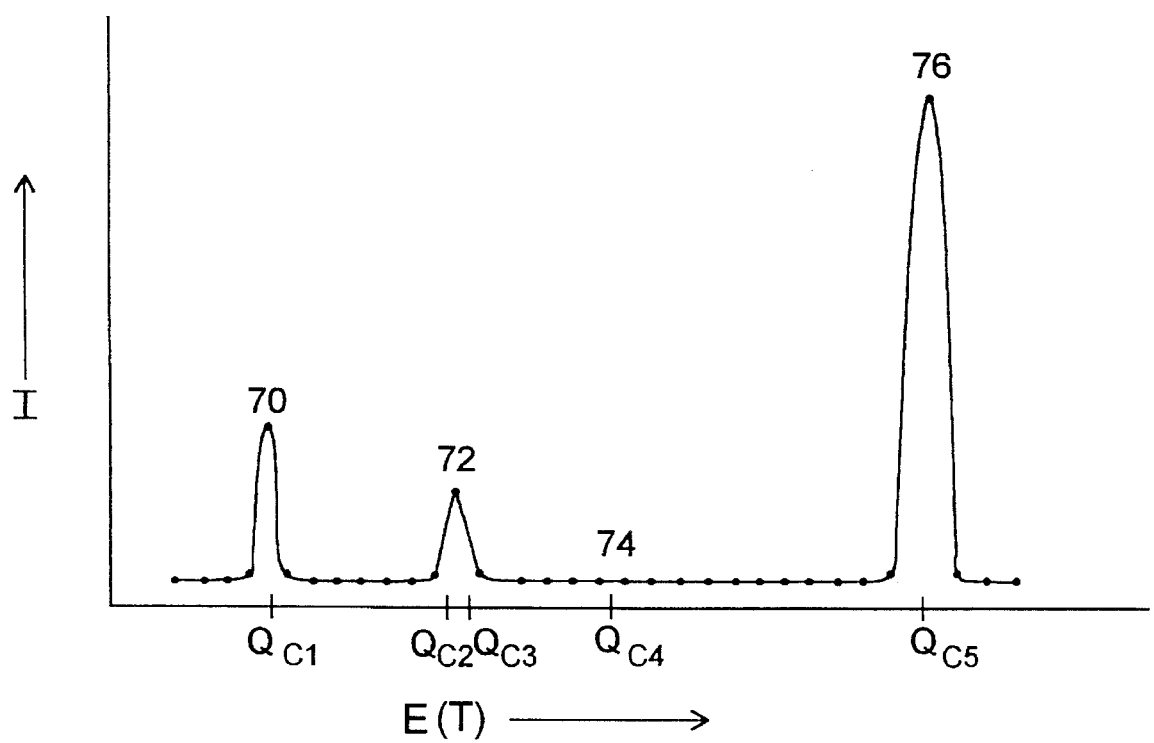
FIG. 3 is a plot of measured current versus applied energy as a function of temperature according to a prior art methodology.

The photon dependant plot in FIG. 4 provides more information than a similar temperature dependant plot in FIG. 3. The increments of the photon energies can be much smaller than the temperature energies. This added resolution and detail results in a more accurate interpolation of the data. As a result, the analysis of the dielectric is more precise.

The FIG. 4 plot also distinguishes between charge carriers of similar charge trap activation energies better than the temperature dependant plot of FIG. 3. Charge carriers such as sodium and lithium have similar charge trap activation energies of 0.3 eV to 1.2 eV, respectively. The Maxwell-Boltzmann probability effect on the activation of the charge carriers and the relatively large increments in energy between current measurements can make it very difficult to distinguish different carriers when thermal depopulation is used as in peak 72 of FIG. 3. The use of photons to excite traped charge carriers eliminates these problems. Photons excite at discrete levels of energy unlike temperature. Also, the photon energies can be increased by very small increments. The small increments allow for better detail around peaks 62 and 64 in FIG. 4. The dielectric can be better characterized when the different types of carriers are more precisely identified and quantified.

The photon method is also better for characterizing trap charge carriers with high activation energies. The high temperatures required to depopulate charge carriers with high activation energies, as in peak 76 of FIG. 3, can detrimentally effect other parts of the device. The photon energy in peak 68 of FIG. 4 will not cause annealing, metallization layer migration or any of the detriments associated with high temperatures. Thus, photons can analyze high activation energy charge carrier traps without damaging the device.

It will be appreciated by those skilled in the art having the benefit of this disclosure that this invention is capable of applications with numerous types of dielectrics. Furthermore, it is to be understood that the form of the invention shown and described is to be taken as a presently preferred embodiment. Various modifications and changes may be made to the dielectric analysis technique and methodology as would be obvious to one skilled in the art after having the benefit of the disclosure. It is intended that the following claims be interpreted to embrace all such modifications and changes and, accordingly, the specification and drawings are to be regarded in an illustrative rather than a restrictive sense.

What is claimed is:

1. A method for characterizing a dielectric formed upon a semiconductor wafer comprising the steps of:

depopulating a plurality of charge carriers from charge carrier traps within a dielectric, said depopulating comprising radiating said dielectric with a plurality of dissimilar photon energies;

measuring a plurality of charge carrier movements, wherein said depopulating provides a plurality of depopulated charge carriers which move in the dielectric during said measuring, and wherein said measuring provides a plurality of charge carrier movement measurements each corresponding respectively to one of said plurality of dissimilar photon energies;

mapping a set of observed points, wherein each of said set of observed points corresponds to one of said plurality of charge carrier movement measurements plotted as a function of said plurality of dissimilar photon energies; and ascertaining from said mapping the characteristics of said dielectric with respect to said charge carrier traps.

2. The method as recited in claim 1, further comprising the step of depositing transparent conductive material upon said dielectric to receive therethrough said photon energies.

3. The method as recited in claim 1, wherein said radiating step comprises the step of increasing the level of said photon energies in discrete amounts.

4. The method as recited in claim 1, wherein said photon energies radiate from a variable monochromatic light source.

5. The method as recited in claim 1, said measuring step comprises:

applying a potential bias across said dielectric, the strength of said potential bias being large enough to attract depopulated charge carriers to one side of said dielectric; and measuring the movement of said depopulated charge carriers with a device adapted for measuring electric currents.

6. The method as recited in claim 1, wherein said ascertaining step comprises determining the magnitude of said depopulated charge carriers from said plurality of charge carrier movement measurements.

7. The method as recited in claim 1, further comprising the step of cooling said dielectric to a temperature where all of said charge carriers populate said charge carrier traps within said dielectric.

8. The method as recited in claim 1, wherein said depopulating step comprises the step of directing said photon energies to specific areas of the semiconductor wafer.

9. A method for characterizing a dielectric formed upon a semiconductor wafer comprising the steps of:

depositing transparent conductive material upon at least a portion of a dielectric, wherein said transparent material is adapted to allow penetration of photons to said dielectric;

depopulating a plurality of charge carriers from charge traps within said dielectric, said depopulating step comprising radiating said dielectric with a plurality of dissimilar photon energies;

measuring a plurality of charge carrier movements, wherein said depopulating provides a plurality of depopulated charge carriers which move in the dielectric during said measuring, and wherein said measuring provides a plurality of charge carrier movement measurements each corresponding to respective ones of said plurality of dissimilar photon energies, comprising the steps of:

applying a potential bias across said dielectric, the strength of said potential bias large enough to attract depopulated charge carriers to one side of said dielectric; and measuring the movement of said depopulated charge carriers with a device adapted for measuring electric currents;

mapping a set of observed points, wherein each of said set of observed points corresponds to one of said measurements of said plurality of charge carrier movement measurements plotted as a function of said plurality of dissimilar photon energies; and ascertaining from said mapping the characteristics of said dielectric with respect to said dielectric charge traps.

10. The method as recited in claim 9, wherein said radiating step comprises the step of increasing the level of said photon energies in discrete amounts.

11. The method as recited in claim 9, wherein said ascertaining step comprises determining the magnitude of said depopulated dielectric charge carriers from said plurality of charge carrier movement measurements.

12. The method as recited in claim 9, wherein said photon energies radiate from a variable monochromatic light source.

13. The method as recited in claim 9, further comprising the step of cooling said dielectric to a temperature where all of said charge carriers populate said charge traps within said dielectric.

14. The method as recited in claim 9, wherein said depopulating step comprises the step of directing said photon energies to specific areas of the semiconductor wafer.

15. A device for characterizing a dielectric within an integrated circuit, comprising:

a semiconductor wafer, said semiconductor wafer containing an integrated circuit having a dielectric formed thereon, said dielectric having opposed surfaces and charge traps extending therebetween, said charge traps populated charge carriers, said charge carriers depopulating from said dielectric charge traps when sufficient energy is applied to said dielectric charge traps;

a voltage source, said voltage source coupled to said integrated device so as to create an electric potential across said dielectric, said electric potential is of sufficient magnitude to attract depopulated charge carriers to one side of said dielectric;

a current measuring device, said current measuring device coupled to said integrated device and said voltage source so as to provide movement measurements of depopulated charge carriers within said dielectric;

a light source adapted to produce a plurality of photons at dissimilar wavelengths, said light source positioned so that said photons radiate towards said integrated circuit with sufficient energy levels to produce depopulated charge carriers within said dielectric; and a data processor connected to said light source and said current measuring device for mapping a set of observed points corresponding to the movement measurements of said depopulated charge carriers as a function of the energy levels of said photons.

16. The device as recited in claim 15, wherein said integrated circuit comprises of transparent conductive material deposited over said dielectric.

17. The device as recited in claim 15, wherein some of said charge carriers obtain energy levels due to ambient thermal energy sufficient to cause depopulation from said charge traps, said device further comprising a cooling system sufficient to lower the energy levels of said charge carriers depopulated due to ambient thermal energy so that said charge carriers depopulated due to ambient thermal energy repopulate said dielectric charge traps.

18. The device as recited in claim 15, wherein said light source moves with respect to said semiconducting wafer.

19. The device as recited in claim 15, further comprising a wafer handler, said wafer handler supporting and positioning said semiconducting wafer.

20. A method for characterizing charge traps in a dielectric formed upon a semiconductor, the method comprising:

radiating the dielectric with photons having an energy level, wherein said energy level corresponds to certain ones of said charge traps such that said energy level is sufficient to depopulate charge carriers from certain ones of the charge traps thereby providing a plurality of charge carriers depopulated from said certain ones of the charge traps;

applying a potential bias across the dielectric, said potential bias acting to create movement of said depopulated charge carriers, said movement being measurable as a current;

measuring said current to provide a depopulated charge carrier current measurement which characterizes said certain ones of the charge traps which correspond to said energy level; and repeating said radiating, said applying, and said measuring, wherein said radiating is repeated at a different energy level so that different certain ones of the charge traps are characterized for each repetition of said radiating, said applying, and said measuring.

21. The method of claim 20, further comprising analyzing characterizations for the different certain ones of the charge traps, said characterizations obtained from said repeating, wherein said analyzing provides a charge trap characterization for the dielectric.

22. The method of claim 20, further comprising depositing a conductive material upon said dielectric, wherein said conductive material is substantially transparent to said photons.

23. The method of claim 20, wherein some of the charge traps have corresponding charge carriers which are depopulated by ambient thermal energy, the method further comprising cooling the dielectric so that said charge carrier depopulated by ambient thermal energy are returned to their corresponding charge traps.

24. A system for characterizing charge traps in a dielectric formed upon a semiconductor, the system comprising:

a radiation source adapted to radiate the dielectric with photons having an energy level, wherein said energy level corresponds to certain ones of said charge traps such that said energy level is sufficient to depopulate charge carriers from certain ones of the charge traps thereby providing a plurality of charge carriers depopulated from said certain ones of the charge traps;

a voltage source coupled to the dielectric and adapted to apply a potential bias across the dielectric, said potential bias acting to create movement of said depopulated charge carriers, said movement being measurable as a current;

a current measuring device coupled to said voltage source, and adapted to measure said current; and wherein said radiation source is further adapted to vary said energy level to a plurality of different energy levels so that said current measuring device provides a depopulated charge carrier current measurement for each one of said plurality of different energy levels.

25. The system of claim 24, wherein some of the charge traps have corresponding charge carriers which are depopulated by ambient thermal energy, the system further comprising a cooling device adapted to cool the dielectric so that said charge carriers depopulated by ambient thermal energy are returned to their corresponding charge traps.

26. The system of claim 24, further comprising a data processor coupled to said radiation source and to said current measuring device, said data processor adapted to correlate said depopulated charge carrier current measurement for each one of said plurality of different energy levels to characterize the charge traps in the dielectric.

27. The system of claim 24, wherein a conductive material is deposited upon said dielectric, said conductive material being substantially transparent to said photons.

28. The system of claim 24, wherein said radiation source comprises a variable monochromatic light source.

29. A method for measuring charge traps in a dielectric formed upon a semiconductor, the method comprising:

radiating the dielectric with a plurality of photon energy levels sufficient to depopulate a set of charge carriers from said charge traps;

applying a potential bias across the dielectric to move the depopulated charge carriers across said dielectric;

measuring current caused by depopulated charge carrier movement; and mapping each of said energy levels used in radiating the dielectric to a corresponding magnitude of said current to quantify charge traps within said dielectric.

30. The method of claim 29, further comprising:

varying the energy level of photons used in radiating the dielectric and measuring a change in resulting current; and correlating the change in resulting current to a quantity of charge traps from which a specific ion charge is depopulated therefrom.

* * * * *

UNITED STATES PATENT AND TRADEMARK OFFICE
CERTIFICATE OF CORRECTION

PATENT NO. : 5,519,334
DATED : May 21, 1996
INVENTOR(S) : Dawson

It is certified that error appears in the above-indentified patent and that said Letters Patent is hereby corrected as shown below:

Claim 23, col. 11, line 46, please delete "carrier" and substitute therefor -- carriers--.

Claim 29, col. 12, line 43, please delete "to a corresponding" and substitute therefor --corresponding to a--.

Signed and Sealed this

Seventeenth Day of September, 1996

Attest:

BRUCE LEHMAN

Attesting Officer    Commissioner of Patents and Trademarks